United States Patent
Mochizuki

[11] Patent Number: 6,078,221
[45] Date of Patent: *Jun. 20, 2000

[54] FIELD EFFECT TRANSISTOR AMPLIFIER

[75] Inventor: Takuji Mochizuki, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/818,150

[22] Filed: Mar. 14, 1997

[30] Foreign Application Priority Data

Mar. 19, 1996 [JP] Japan ................................. 8-062547

[51] Int. Cl.[7] .................................................. H03F 3/60
[52] U.S. Cl. .......................................... 330/286; 333/33
[58] Field of Search .................................. 330/277, 286, 330/302; 333/1.1, 24.1, 33

[56] References Cited

U.S. PATENT DOCUMENTS 4,885,541  12/1989  Hayes ................................. 330/286 X
5,144,266   9/1992  Dougherty et al. ................... 333/1.1 X
5,886,595   3/1999  von Stein ............................. 333/33 X

FOREIGN PATENT DOCUMENTS 01078010  9/1987  Japan ................................. H03F 3/60
63-062405  3/1988  Japan ................................. H03F 3/60
63-62405   3/1988  Japan .

*Primary Examiner*—Steven J. Mottola
*Attorney, Agent, or Firm*—Ostrolenk, Faber, Gerb & Soffen, LLP

[57] ABSTRACT

Disclosed is a field effect transistor amplifier using a field effect transistor as an amplification device, including a coaxial dielectric resonance device inserted between the input terminal of the amplifier and the input terminal of the amplification device and having a $\lambda/2$ electrical length and a characteristic impedance lower than the input-side impedance at the input terminal.

9 Claims, 9 Drawing Sheets

FIELD EFFECT TRANSISTOR AMPLIFIER

BACKGROUND OF THE INVENTION

1. Field of the Invention

The present invention relates to an amplifier using a field effect transistor (to be referred to as an FET hereinafter) and, more particularly, to an FET amplifier which is used as a low-noise amplifier for satellite communication or the like and realizes noise reduction in a wide band with a compact circuit.

2. Description of the Prior Art

In a low-noise amplifier for satellite communication, a radio wave reaching from a satellite to the ground becomes very weak because of attenuation in the radio wave propagation path between the satellite and the ground or a limitation in transmission capability of the satellite itself. For this reason, noise generated in the amplifier itself is required to be minimized. In recent satellite communication, the frequency band used is broadening along with an increase in traffic, and the amplifier must also cope with a wide band. Therefore, the FET amplifier must have a circuit arrangement capable of simultaneously meeting these two requirements. Studies have been made to meet these requirements by improving the input-side circuit of the FET amplifier.

Generally, when a lossless matching circuit M1 is connected to the input side of an FET 1, as shown in FIG. 1, the noise figure of the FET 1 is determined by the source admittance (Ys=Gs+jBs) of the input circuit, as represented by the equation below:

$$F = Fo + Rn/Gs\{(Gs - Go)^2 + (Bs - Bo)^2\}$$

F: noise figure defined by the input circuit
Fo: optimum noise figure
Rn: equivalent input noise resistance
Go: conductance giving optimum noise figure
Bo: susceptance giving optimum noise figure
Gs: conductance of the input circuit (source conductance)
Bs: the susceptance of the input circuit (source susceptance)

To constitute a noise optimum FET amplifier on the basis of this equation, it is preferable to make the source admittance (Ys=Gs+jBs) match the noise optimum admittance (Yo=Go+jBo) defined by the FET. Reference symbol M2 in FIG. 1 denotes an output matching circuit.

In the conventional FET amplifier, as shown in FIG. 2, an output terminal 23 of an impedance improving isolator 2 having an input terminal 21 with transformers 24 to 26, a dummy terminal 22, and an output terminal 23 terminated at 50 Ω is connected to the input terminal of the FET 1 through a λ/4 microstrip line 11 and an FET lead inductance 12, thereby attaining matching for realizing optimum noise. Reference numeral 13 denotes an output matching circuit. In this circuit arrangement, however, a loss generated in the matching circuit between the transformer 26 of the isolator output portion and the λ/4 microstrip line 11 degrades the noise figure of the FET amplifier. The source impedance of this amplifier exhibits a locus C in the Smith chart of FIG. 3 when noise matching is achieved. However, the source impedance for obtaining optimum noise is normally represented by a locus D in FIG. 3. The two loci have opposite frequency directions and therefore cross each other. An increase in noise at the band ends cannot be avoided, and broad-band noise matching cannot be obtained.

To solve this crossing of the frequency loci after noise matching, Japanese Unexamined Patent Publication No. 63-62405 discloses a microwave amplifier having a circuit arrangement for realizing noise reduction in a wide band. This microwave amplifier has an FET 1 arranged on the surface of a dielectric substrate with a ground conductor formed on its surface and includes an input matching circuit 30 arranged between an input portion IN and the gate of the FET 1, as shown in FIG. 4A. The input matching circuit 30 comprises an open-circuited stub 31 arranged at the input portion, microstrip lines 32 and 33 for connecting the input portion to the gate of the FET, and a short-circuited stub 34 arranged at a point on the microstrip line. Even when a capacitor C is inserted between the ground and the distal end of another microstrip line 35 instead of arranging the short-circuited stub 34, a short end circuit can be realized, as shown in FIG. 4B.

The change in input impedance locus of the amplifier disclosed in this prior art will be described. The reflection coefficient from the gate of the FET to the input side of the input matching circuit 30 is represented by $\Gamma_s$, and the reflection coefficients from the respective elements of the input matching circuit 30 to the input side are represented by $\Gamma_1$, $\Gamma_2$, and $\Gamma_3$. The electrical length of the open-circuited stub 31, the microstrip lines 32 and 33, and the short-circuited stub 34 is optimized so that the reflection coefficients $\Gamma_1$ to $\Gamma_3$ and $\Gamma_s$ change along loci 41 to 44 on the Smith chart of FIG. 5, respectively. The reflection coefficient $\Gamma_2$ which has changed along the locus 42 in the open-circuited stub 31 and the microstrip line 32 changes to the reflection coefficient $\Gamma_3$ along the locus 43 in the short-circuited stub 34. The locus $\Gamma_3$ is converted into $\Gamma_s$ (44) by phase rotation along the microstrip line 33 and overlaps an optimum input load reflection coefficient $\Gamma_{opt}$ (45) of the FET. Normally, phase rotation of a microstrip line becomes larger as the frequency becomes higher. For this reason, when the locus $\Gamma_3$ reaches the position of the locus $\Gamma_s$, the length of the locus is small. However, since the displacement from $\Gamma_{opt}$ (45) to $\Gamma_s$ (44) can be reduced as compared to the arrangement shown in FIG. 2, the arrangement shown in FIG. 4A or 4B can realize noise matching in a wide band.

In a low-noise amplifier for satellite communication, to apply the amplifier to the reception system without degrading the characteristics of the amplifier even when the input impedance condition changes in a device arrangement including an amplifier input feed unit and an antenna, an isolator is normally inserted to ensure the input impedance. When the circuit shown in FIG. 4A or 4B is applied for satellite communication, a 50-Ω matched three-terminal isolator is connected to the input side. Therefore, the noise figure drops by the loss of the isolator.

In the improved amplifier shown in FIG. 4A or 4B, broadening of the noise figure in terms of frequency can be attained to some extent, though the noise figure as an absolute value is poor. When a 50-Ω matched isolator is added to the prior art, the noise figure suffers by the loss of the isolator. The reason for this is as follows. Since a plurality of devices (open-circuited and short-circuited stubs) associated with input broad-band matching and microstrip lines are formed on the dielectric substrate, noise degradation is caused by an increase in insertion loss. The scale of the circuit including the input matching circuit becomes large, hampering a size reduction of the device. This is because the input matching circuit is constituted and realized by microstrip lines as a distributed parameter circuit. As the frequency becomes lower, the electrical length becomes larger, and the scale of the circuit on the substrate also tends to be larger.

SUMMARY OF THE INVENTION

The present invention has been made in consideration of the above situation, and has as its object to provide a field effect transistor amplifier which realizes a broad-band low-noise amplifier using an FET with a compact and lossless input circuit arrangement to improve the characteristics of the FET amplifier and also reduces the size of the device.

In order to achieve the above object, according to the basic aspect of the present invention, there is provided a field effect transistor amplifier comprising a coaxial dielectric resonance device inserted between an input terminal of the amplifier and an input terminal of an FET and having a $\lambda/2$ electrical length and a characteristic impedance lower than an input-side impedance from the input terminal of the amplifier to the input terminal of the FET. The coaxial dielectric resonance device having the $\lambda/2$ electrical length comprises a TEM mode dielectric resonator consisting of a high dielectric formed into a cylindrical shape with a predetermined axial length, an outer conductor formed by metallizing an outer surface of the dielectric with a conductive material, and an inner conductor formed by metallizing an inner wall of the dielectric with a conductive material. The coaxial dielectric resonance device having the $\lambda/2$ electrical length has an inner conductor exposed to one end connected to the input terminal side of the amplifier and the internal conductor exposed to the other end connected to the input terminal side of the FET.

In the present invention, preferably, an isolator consisting of a three-terminal circulator with a terminated one end is arranged on the input side of the amplifier, and a ferrite end face of the central conductor of the isolator is connected to the coaxial dielectric resonance device having the $\lambda/2$ electrical length as an output terminal. In addition, preferably, an input-side lead inductance is connected to the input terminal of the amplification device.

As described above, when a $\lambda/2$ line constituted by a low-loss and compact coaxial dielectric resonance device is connected to the input terminal of the FET, and the characteristic impedance of this $\lambda/2$ line is made lower than the impedance at the input terminal of the amplifier, the $\lambda/2$ line generates series resonance. The high-frequency impedance of the input-end impedance extends in the direction of capacitance in terms of admittance, and the low-frequency extends in the direction of permittivity in terms of admittance. Assume that this extended impedance locus is rotated by the FET input-side lead inductance of the FET in the direction of permittivity on a Smith chart. Even if rotation by the permittivity becomes larger as the frequency becomes higher in impedance conversion by the FET input-side lead inductance, the impedance originally has a locus on the Smith chart (impedance chart) by series resonance of the $\lambda/2$ line in which the high-frequency impedance extends to the lower side, and the low-frequency impedance extends to the upper side. Therefore, input noise matching is performed so that the optimum noise locus and frequency direction do not change, and a similar form of extension of the locus is obtained while maintaining the form of extension (relative positional relationship between the high-frequency impedance and the low-frequency impedance) of the locus after impedance conversion by the FET lead inductance.

The loss of the input portion will be considered. The loss in impedance conversion of the isolator can be eliminated by omitting the 50-$\Omega$ matched input isolator output portion. The loss of the input matching portion can be reduced by constituting the $\lambda/2$ line by a small and high-Q coaxial dielectric resonance device. With the above arrangement, a lossless input matching circuit can be formed. Therefore, noise reduction in the entire band can be achieved by minimizing the loss of the input circuit while realizing broad-band noise matching.

In the present invention, the number of necessary main devices associated with input broad-band matching is decreased, and the main device ($\lambda/2$ coaxial dielectric resonance device) is made small. This arrangement contributes to size reduction of the device and also facilitates assembly. The reason for this is as follows. When a coaxial line formed by removing conductors on both sides of the TEM mode coaxial dielectric resonance device serving as a $\lambda/2$ coaxial transmission line is manufactured using a material with a high Q and high permittivity, the effective coaxial length and diameter can be reduced.

In addition, according to the present invention, the shield characteristics of the input matching circuit can be improved. Therefore, an adverse effect of an external interference wave or feedback oscillation can be prevented and the circuit can be stably operated. This is because the $\lambda/2$ line serving as an input matching circuit is constituted by the coaxial dielectric substrate device, and the conductor in the transmission line is shielded by metallizing the outer surface.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Figure 6:
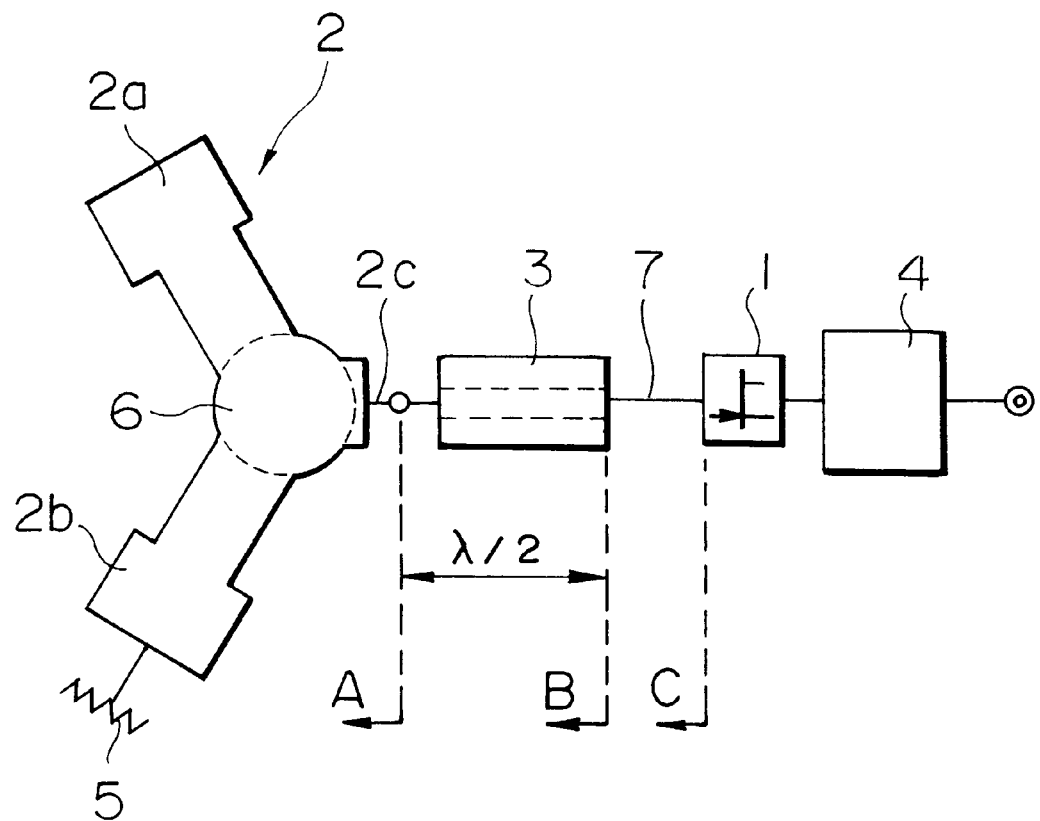
FIG. 6 is a block diagram showing the arrangement of an embodiment of the present invention.

Preferred embodiments of the present invention will be described below with reference to the accompanying drawings. FIG. 6 is a block diagram showing the arrangement of the first embodiment of the present invention. Referring to FIG. 6, reference numeral 1 denotes a field effect transistor (FET) as an amplification device. An isolator 2 and a λ/2 coaxial line 3 are connected to the input side of the FET 1, and an output matching circuit 4 is connected to the output side of the FET 1. The isolator 2 is constituted by a generally known three-terminal strip line circulator. Reference numeral 2a denotes an input terminal formed by a strip line; 2b, a dummy connection terminal having the same structure as that of the input terminal 2a and connected to a dummy terminal 5; and 2c, an output terminal directly connected from the strip line on the ferrite end face to the load side. A ferrite 6 is arranged at the center of the isolator 2 while interposing a conductor.

Figure 7A:
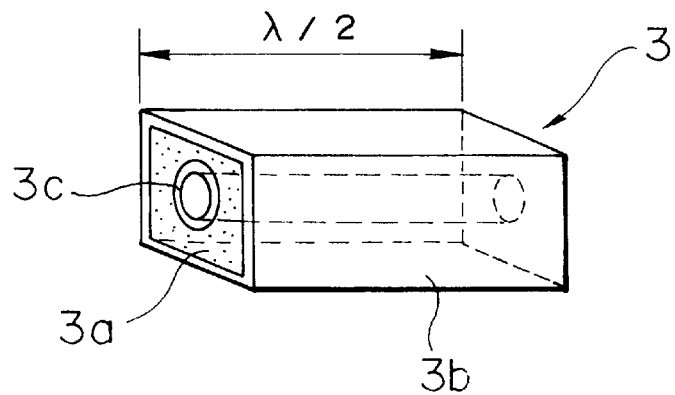
FIGS. 7A to 7C are perspective and sectional views, respectively, showing the $\lambda/2$ line of the present invention.
Figure 7B:
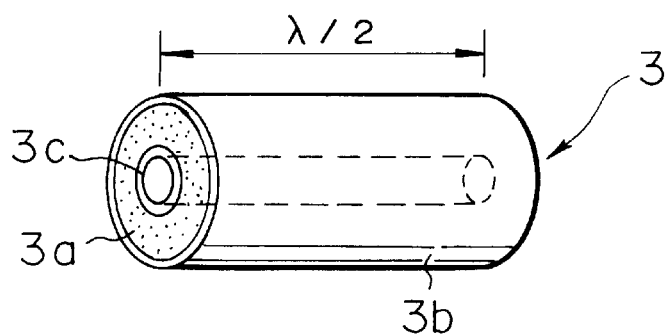
Figure 7C:
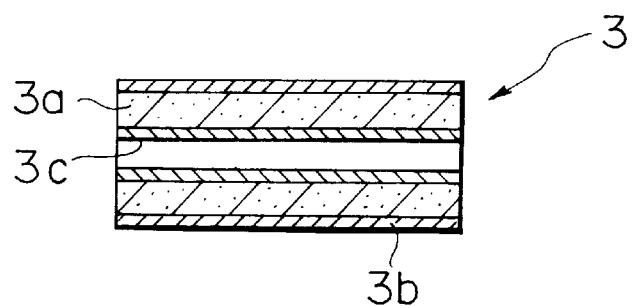

The output terminal 2c of the isolator with the above structure is directly soldered to the central conductor on one end side of the coaxial dielectric resonance device 3 having a λ/2 electrical length and a characteristic impedance lower than the output impedance (defined as an input terminal) of the ferrite end, thereby constituting a microwave circuit. As shown in the perspective views of FIGS. 7A and 7B and the sectional view of FIG. 7C, the coaxial dielectric resonance device 3 having the λ/2 electrical length is formed as follows. A dielectric material having a high Q and high permittivity is formed into a parallelepiped or circular cylinder 3a having a predetermined axial length. The outer surface is metallized with a conductive material to form an outer conductor 3b. An axial cavity is formed at the central portion of the end face of the dielectric device, and the inner wall is metallized with a conductive material to form an inner conductor 3c, thereby constituting a TEM mode dielectric resonator. The conductive surfaces at the two ends are removed to form open ends, so that a coaxial transmission line is constituted. An FET lead inductance 7 is soldered to the central conductor on the other end side of the λ/2 coaxial dielectric resonance device 3 and connected to the FET 1.

According to the FET amplifier having the above structure, an input signal supplied to the input terminal 2a of the isolator 2 is supplied from the output terminal 2c to the FET 1 through the λ/2 coaxial dielectric resonance device 3 and the FET lead inductance 7. A reflection wave generated at the input terminal of the FET 1 enters the isolator 2 again and is consumed by the dummy terminal 5 through the dummy connection terminal 2b. The signal amplified by the FET 1 is supplied to a load through the output matching circuit 4. By adjusting the characteristic impedance value of the λ/2 coaxial dielectric resonance device 3, the input circuit of the FET 1 can be set to a source impedance for obtaining optimum noise. The variable range of the characteristic impedance value of the λ/2 coaxial dielectric resonance device 3 is set to be narrower than that of the output impedance of the ferrite end 2c of the isolator.

Figure 8:
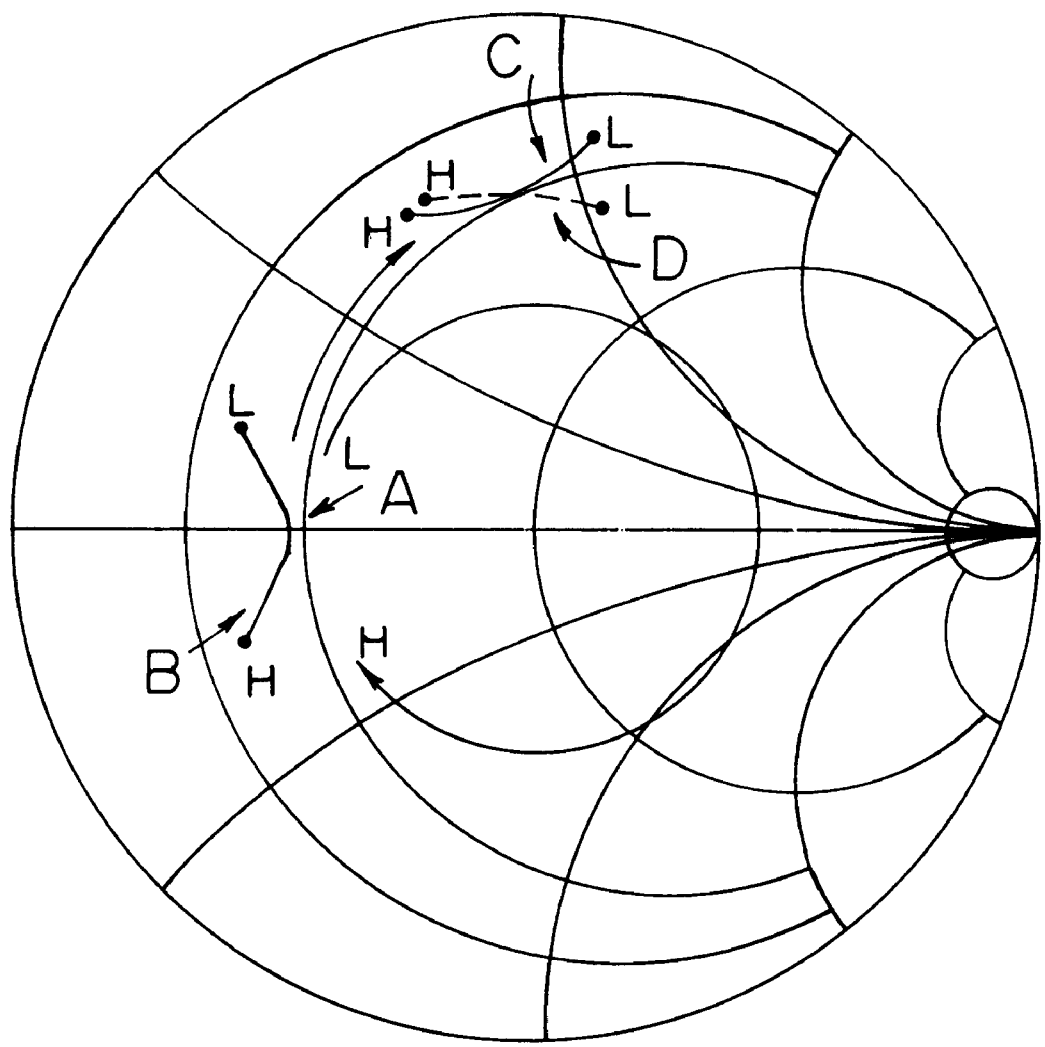
FIG. 8 is a Smith chart for explaining the operation of the embodiment shown in FIG. 6.

The operation of the FET amplifier will be described below in detail with reference to the Smith chart in FIG. 8. Referring to FIG. 8, a locus A represents the impedance at a point A of the output terminal of the isolator 2 obtained in the embodiment shown in FIG. 6 in a wide frequency band. A locus B represents the impedance at a point B of the output terminal of the λ/2 coaxial dielectric resonance device 3. The locus B is obtained by rotating the locus A by λ/2 (one revolution) in terms of phase on the Smith chart by the characteristic impedance of the λ/2 coaxial dielectric resonance device 3. When the locus returns to the original position, the high frequency extends to the lower side, and the low frequency extends to the upper side, unlike the locus A. This equals the series resonance effect by the λ/2 coaxial dielectric resonance device 3.

A locus C represents the source impedance at a point C of the input terminal of the FET 1. The locus C is obtained by rotating the locus B in the dielectric direction on the chart by the FET lead inductance 7. In impedance conversion by the FET lead inductance 7, the inductance rotation by the permittivity becomes larger as the frequency becomes higher. However, since the locus B already sufficiently extends to the high-frequency and low-frequency directions due to the series resonance effect of the λ/2 coaxial dielectric resonance device 3, the frequency direction of the locus C becomes eventually equal to that at the position of an optimum noise locus D, and a similar form of extension of the locus is obtained, though the extension of the locus by the FET lead inductance 7 is reduced from the locus B to the locus C.

Figure 9:
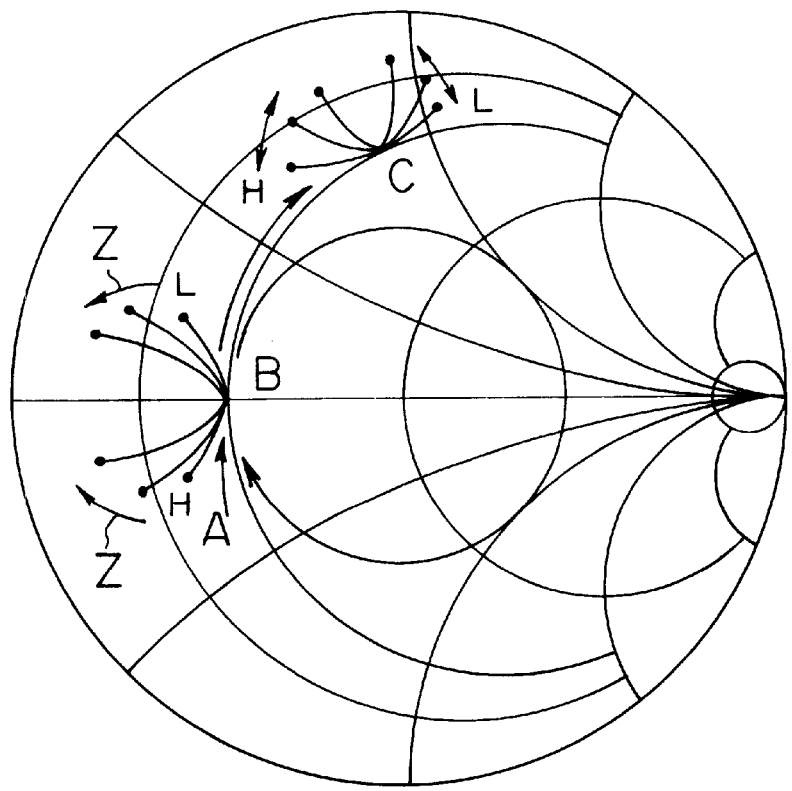
FIG. 9 is a Smith chart for explaining a change in locus of the characteristic impedance of the $\lambda/2$ line in the embodiment shown in FIG. 6.

As an adjustment device for the source impedance locus C, a device is prepared by changing the characteristic impedance of the λ/2 coaxial dielectric resonance device 3, i.e., the ratio of the outer diameter to the inner diameter of the coaxial device. The locus C changes as shown in FIG. 9. By using this effect, the locus can be matched with the optimum noise locus. In FIG. 9, reference symbol Z represents the characteristic impedance of the λ/2 line.

In the circuit arrangement of this embodiment, the loss in impedance conversion of the isolator is eliminated by omitting the 50-Ω matched input isolator output portion, and the loss of the input matching portion is reduced by constituting a λ/2 coaxial line by a compact and high-Q dielectric resonance device. With this arrangement, a decrease in loss of each device can be realized while minimizing the number of necessary main devices associated with input broad-band matching as compared to the prior art. Therefore, the degradation in noise figure as an absolute value can be minimized, and broad-band noise matching can be realized.

Figure 10:
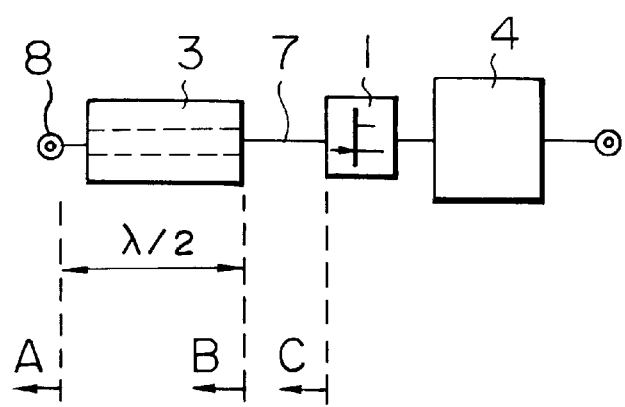
FIG. 10 is a block diagram showing the arrangement of another embodiment of the present invention.

The second embodiment of the present invention will be described below with reference to FIG. 10. Referring to FIG. 10, the input terminal is connected to an input-side load and already has an actual resistance component (e.g., 50 Ω) as an arbitrary input-side impedance. Reference numeral 1 denotes a field effect transistor (FET); 8, an input terminal; 7, an FET lead inductance; 3, a λ/2 coaxial line using a dielectric resonance device; and 4, an output matching circuit. The input terminal 8 is soldered to the central conductor on one end side of the coaxial dielectric resonance device 3 having a λ/2 electrical length and a characteristic impedance lower than the impedance on the input side. In addition, the FET lead inductance 7 is soldered to the central conductor at the other end of the λ/2 coaxial dielectric resonance device 3, and the FET 1 is connected to the FET lead inductance 7. The coaxial dielectric resonance device 3 having the λ/2 electrical length is the same as in the first embodiment. The flow of an input signal is also the same as that after the isolator ferrite terminal in the first embodiment.

The input terminal of the second embodiment is directly constituted by, e.g., a waveguide transducer. By using the difference in field strength distribution in the waveguide, which changes depending on the insertion position of the 50-Ω line as the input terminal of the waveguide, the actual resistance value as an arbitrary input-side impedance can be realized.

Figure 1:
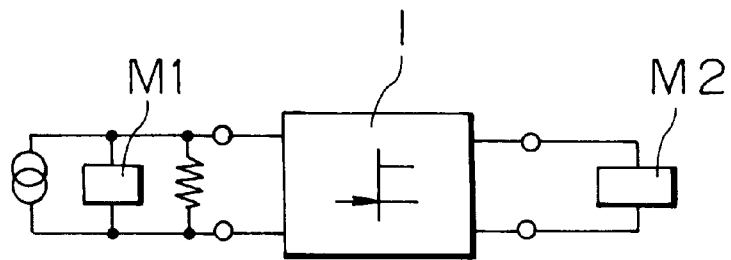
FIG. 1 is a block diagram showing the arrangement of a prior art.
Figure 2:
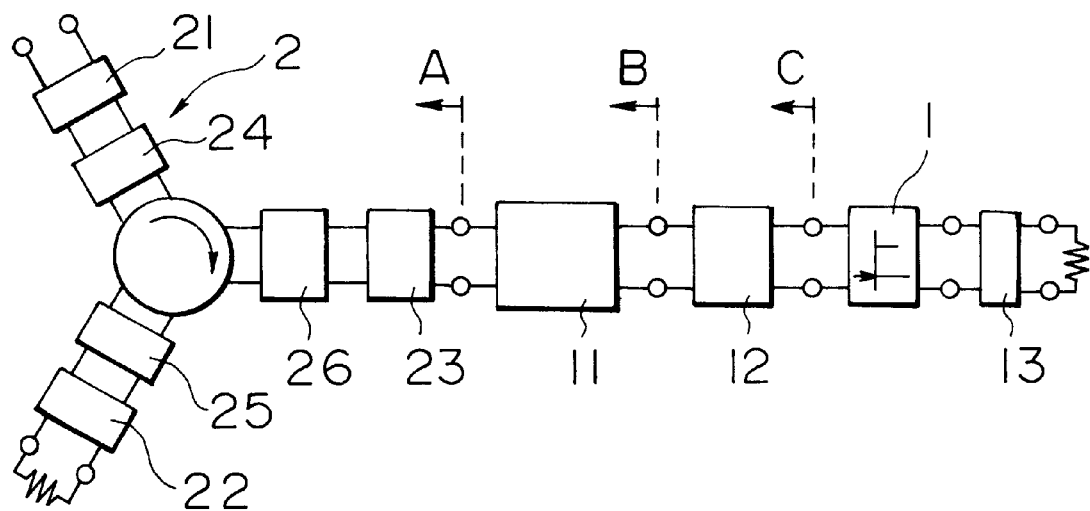
FIG. 2 is a block diagram showing the detailed arrangement of another prior art.
Figure 3:
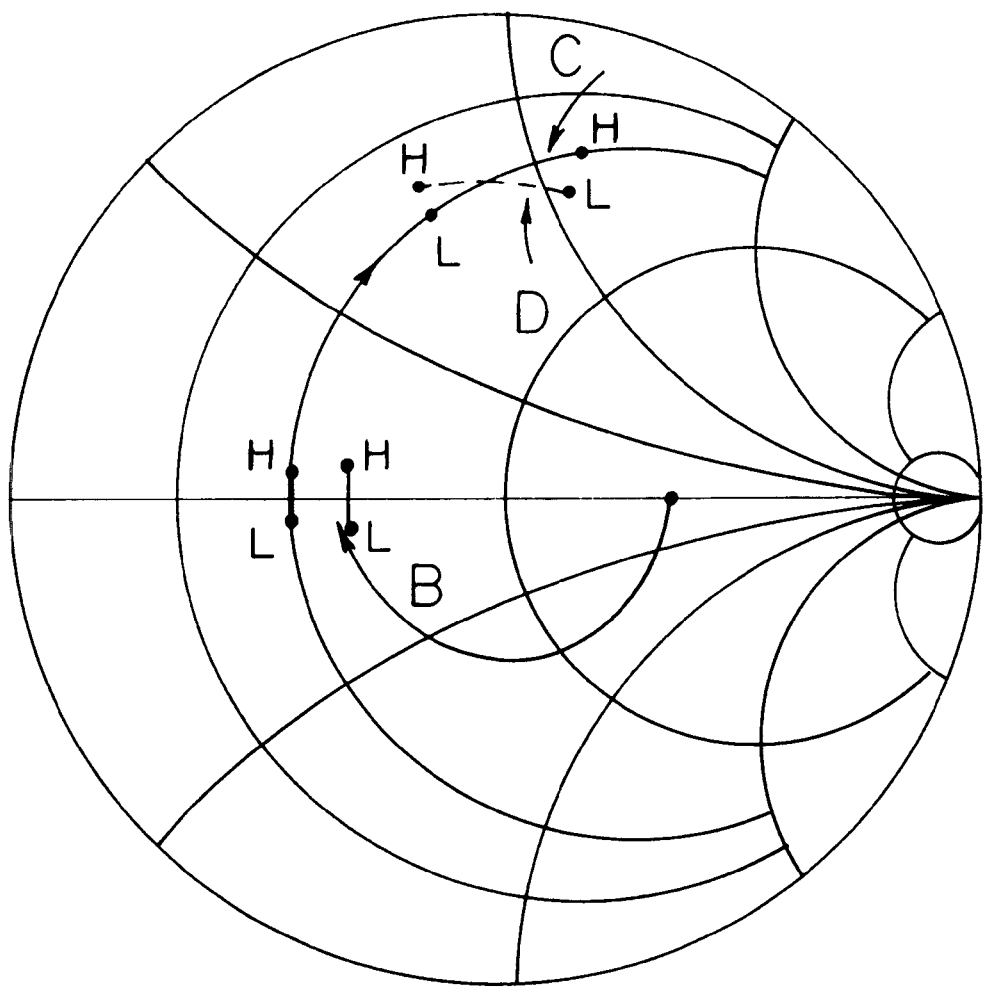
FIG. 3 is a Smith chart for explaining the operation of the prior art shown in FIG. 2.
Figure 4A:
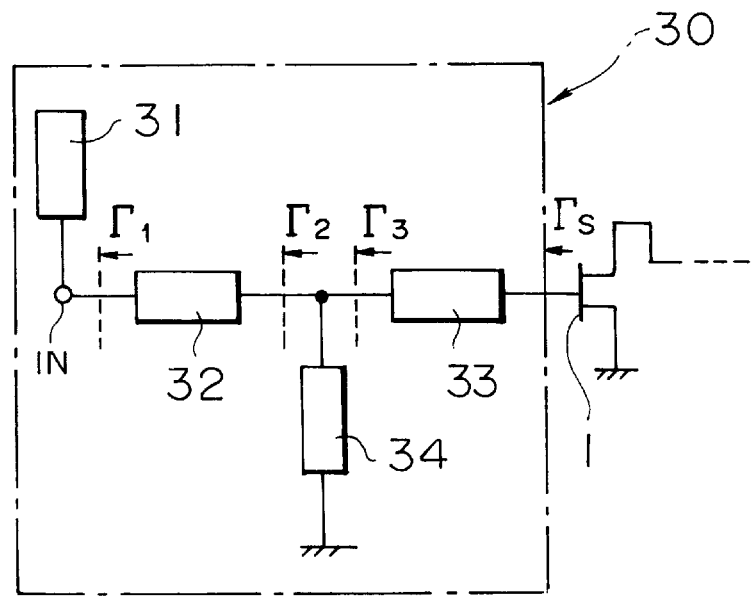
FIGS. 4A and 4B are block diagrams showing the arrangement of the improved input matching circuit of the prior art and a modification thereof, respectively.
Figure 4B:
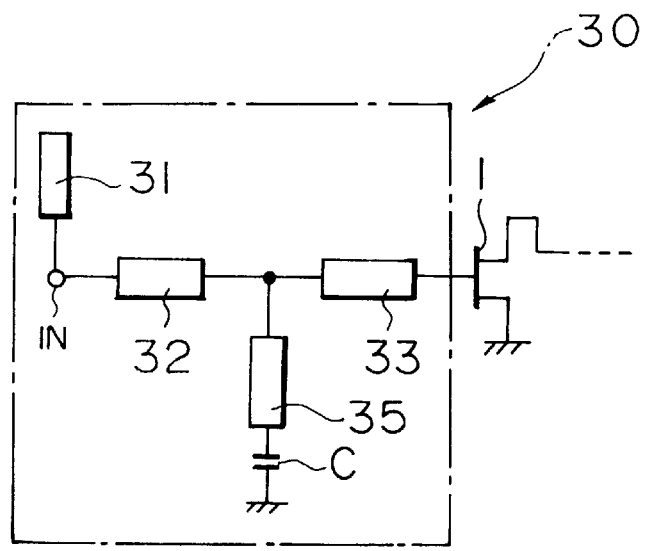
Figure 5:
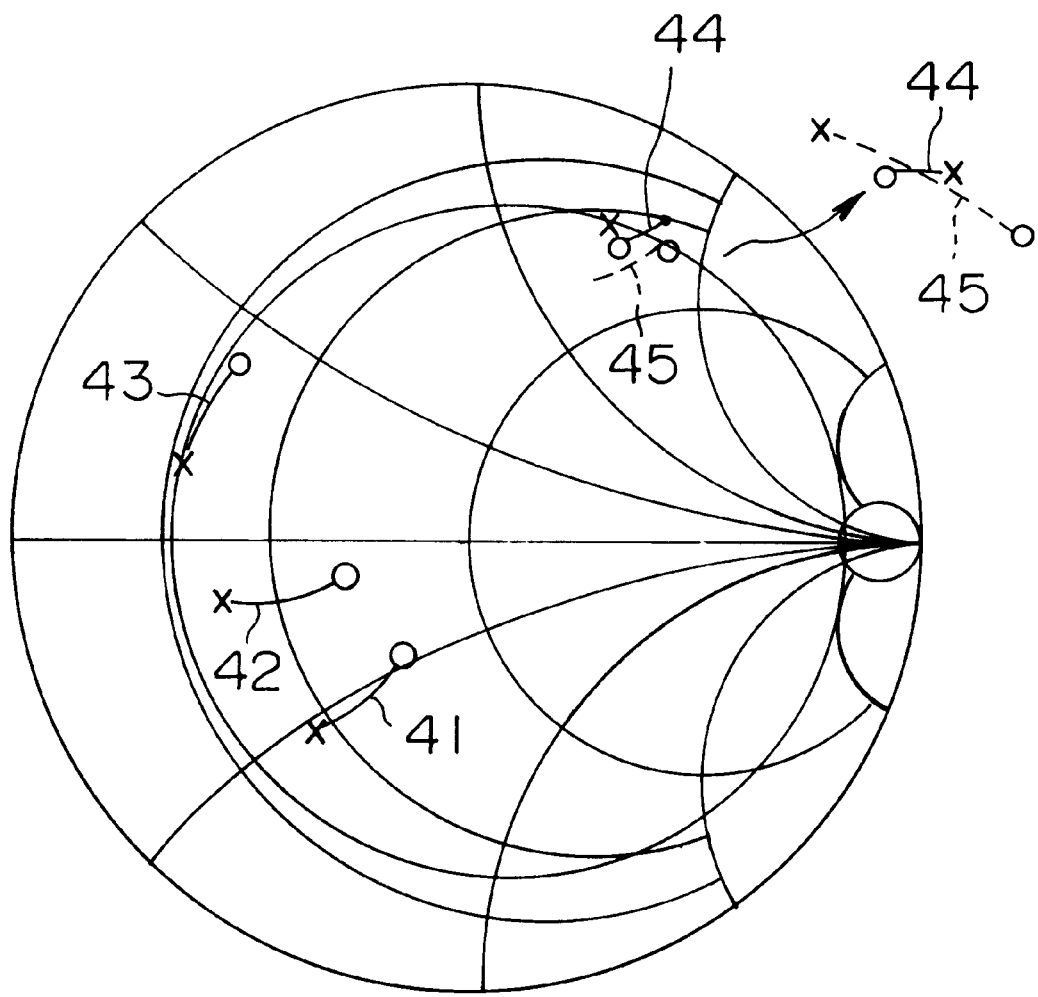
FIG. 5 is a Smith chart for explaining the operation of the prior art shown in FIG. 4A or 4B.
Figure 11:
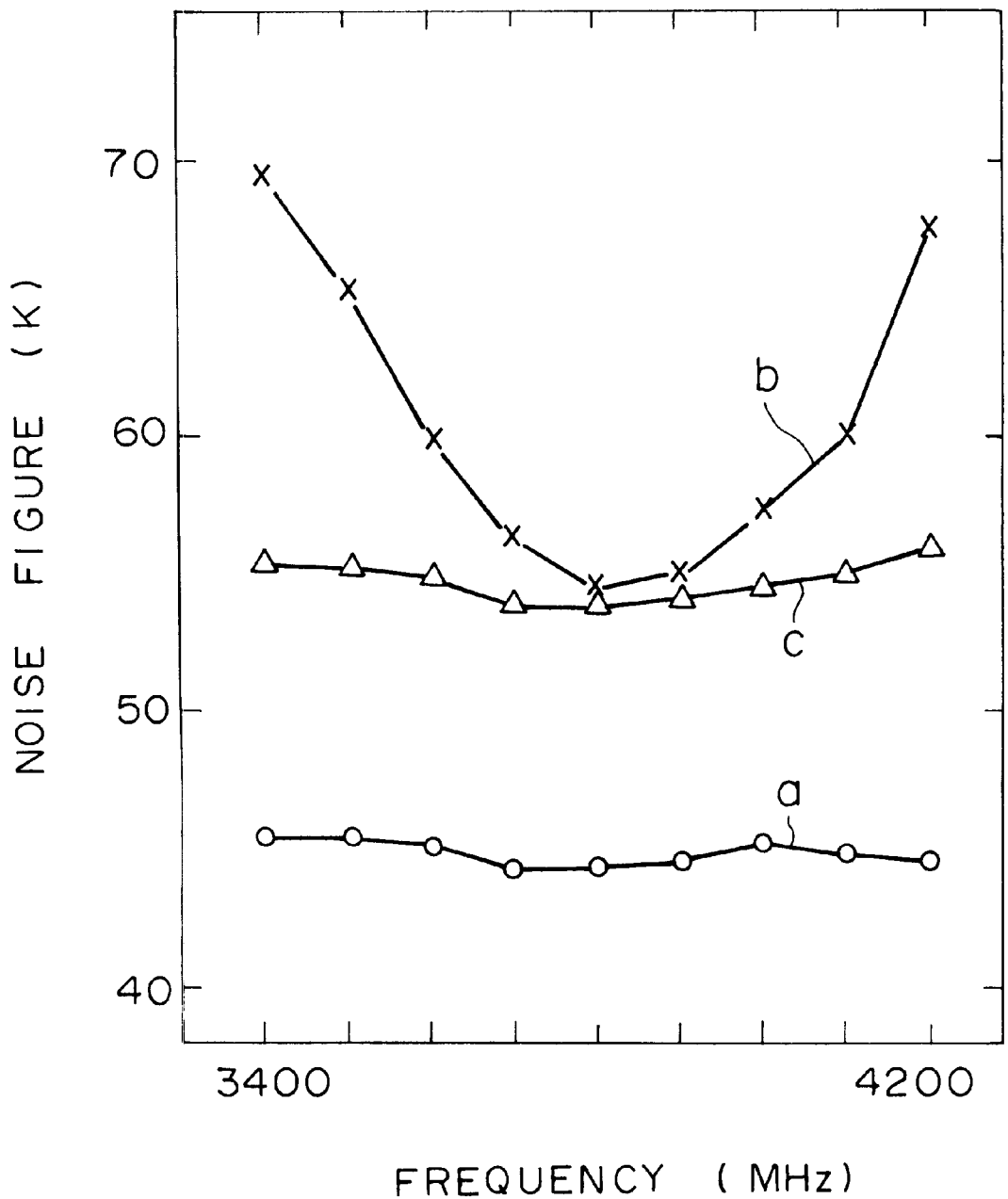
FIG. 11 is a graph showing the effect of the present invention compared with the prior arts.

As described above, in the amplifier according to the first or second embodiment, the input circuit loss is minimized while broad-band noise matching is realized. With this arrangement, noise as an absolute value can be reduced in the entire band. FIG. 11 is a graph showing the noise-to-temperature characteristics. A curve a represents the characteristics of the present invention; a curve b, the characteristics of the prior art shown in FIG. 2; and a curve c, the characteristics of the improved prior art shown in FIG. 4A or 4B. In the amplifier according to the first or second embodiment, the number of necessary devices associated with input broad-band matching is reduced, and the $\lambda/2$ coaxial dielectric resonance device is made small. Therefore, a size reduction of the device is enabled, and assembly is facilitated. Additionally, the shield characteristics of the input matching circuit portion are improved. Since an adverse effect of an external interference wave or feedback oscillation is prevented, the circuit can be stably operated.

What is claimed is:

1. An amplifier comprising:
   an input terminal;
   a field effect transistor as an amplification device; and
   a solitary coaxial dielectric resonance device inserted between said input terminal of said amplifier and an input terminal of said amplification device and having a $\lambda/2$ electrical length and a characteristic impedance lower than an input-side impedance at said input terminal of said amplifier.

2. An amplifier according to claim 1, wherein said coaxial dielectric resonance device having the $\lambda/2$ electrical length comprises a TEM mode dielectric resonator consisting of a high dielectric formed into a cylindrical shape with a predetermined axial length, an outer conductor formed by metallizing an outer surface of said dielectric with a conductive material, and an inner conductor formed by metallizing an inner wall of said dielectric with a conductive material.

3. An amplifier according to claim 1, wherein said coaxial dielectric resonance device having the $\lambda/2$ electrical length has an inner conductor exposed to one end connected to said input terminal side of said amplifier and said internal conductor exposed to the other end connected to said input terminal side of said amplification device.

4. An amplifier according to claim 1, further comprising an isolator consisting of a three-terminal circulator with a terminated one end, and wherein a ferrite end face of a central conductor of said isolator is connected to said coaxial dielectric resonance device having the $\lambda/2$ electrical length.

5. An amplifier according to claim 4, wherein an input-side lead inductance is connected to said input terminal of said amplification device.

6. An amplifier comprising:
   an input terminal;
   a field effect transistor as an amplification device;
   a coaxial dielectric resonance device inserted between said input terminal of said amplifier and said input terminal of said amplification device and having a $\lambda/2$ electrical length and a characteristic impedance lower than an input-side impedance at said input terminal of said amplifier; and
   an isolator consisting of a three-terminal circulator with a terminated one end, wherein a ferrite end face of a central conductor of said isolator is connected to said coaxial dielectric resonance device having the $\lambda/2$ electrical length.

7. An amplifier comprising:
   an input terminal;
   a field effect transistor as an amplification device; and
   a coaxial dielectric resonance device connected directly between said input terminal of said amplifier and an input terminal of said amplification device and having a $\lambda/2$ electrical length and a characteristic impedance lower than an input-side impedance at said input terminal of said amplifier.

8. An amplifier according to claim 7, wherein said coaxial dielectric resonance device having the $\lambda/2$ electrical length comprises a TEM mode dielectric resonator consisting of a high dielectric formed into a cylindrical shape with a predetermined axial length, an outer conductor formed by metallizing an outer surface of said dielectric with a conductive material, and an inner conductor formed by metallizing an inner wall of said dielectric with a conductive material.

9. An amplifier according to claim 7, wherein said coaxial dielectric resonance device having the $\lambda/2$ electrical length has an inner conductor exposed to one end connected to said input terminal side of said amplifier and said internal conductor exposed to the other end connected to said input terminal side of said amplification device.

* * * * *